(12) United States Patent
Yoshida et al.

(10) Patent No.: US 12,294,061 B2
(45) Date of Patent: May 6, 2025

(54) BATTERY RESISTANCE MEASUREMENT DEVICE, VEHICLE AND BATTERY RESISTANCE MEASUREMENT METHOD

(71) Applicant: TOYOTA JIDOSHA KABUSHIKI KAISHA, Toyota (JP)

(72) Inventors: Hiroshi Yoshida, Anjo (JP); Yuto Baba, Nisshin (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 646 days.

(21) Appl. No.: 17/674,493

(22) Filed: Feb. 17, 2022

(65) Prior Publication Data

US 2022/0294029 A1    Sep. 15, 2022

(30) Foreign Application Priority Data

Mar. 12, 2021    (JP) ................................ 2021-040348

(51) Int. Cl.

| | |
|---|---|
| *H01M 10/42* | (2006.01) |
| *B60L 1/00* | (2006.01) |
| *B60L 53/00* | (2019.01) |
| *B60L 58/10* | (2019.01) |
| *G01R 31/389* | (2019.01) |
| *H02J 7/00* | (2006.01) |
| *H01M 10/0525* | (2010.01) |

(52) U.S. Cl.
CPC ........... *H01M 10/425* (2013.01); *B60L 1/003* (2013.01); *B60L 53/00* (2019.02); *B60L 58/10* (2019.02); *G01R 31/389* (2019.01); *H02J 7/0048* (2020.01); *H01M 10/0525* (2013.01); *H01M 2010/4271* (2013.01); *H01M 2220/20* (2013.01)

(58) Field of Classification Search
CPC ........................... H01M 10/425; G01R 31/389
See application file for complete search history.

(56) References Cited

U.S. PATENT DOCUMENTS

2011/0291619 A1\* 12/2011 Asakura .............. H01M 10/441
                                                              320/134
2018/0252776 A1   9/2018 Takechi et al.

FOREIGN PATENT DOCUMENTS

| JP | 2004-031170 A |   | 1/2004 |
|---|---|---|---|
| JP | 2018013456 A | \* | 1/2018 |

\* cited by examiner

*Primary Examiner* — Walter L Lindsay, Jr.
*Assistant Examiner* — Milton Gonzalez
(74) *Attorney, Agent, or Firm* — Sughrue Mion, PLLC

(57) ABSTRACT

A battery resistance measurement system measures an electrical resistance of a battery and comprises a determination unit and a measurement unit. The determination unit determines, based on whether a predetermined condition is satisfied, whether a target battery has switched from a charged state to a discharged state in which while the target battery receives supplied electric power the target battery outputs electric power larger than the supplied electric power. The measurement unit starts measuring the electrical resistance of the target battery at a time when the determination unit determines that the target battery is switched from the charged state to the discharged state.

8 Claims, 10 Drawing Sheets

《LOW TEMPERATURE / PERMISSION MODE》

《LOW TEMPERATURE / PROHIBITING MODE》

《HIGH TEMPERATURE / PERMISSION MODE》

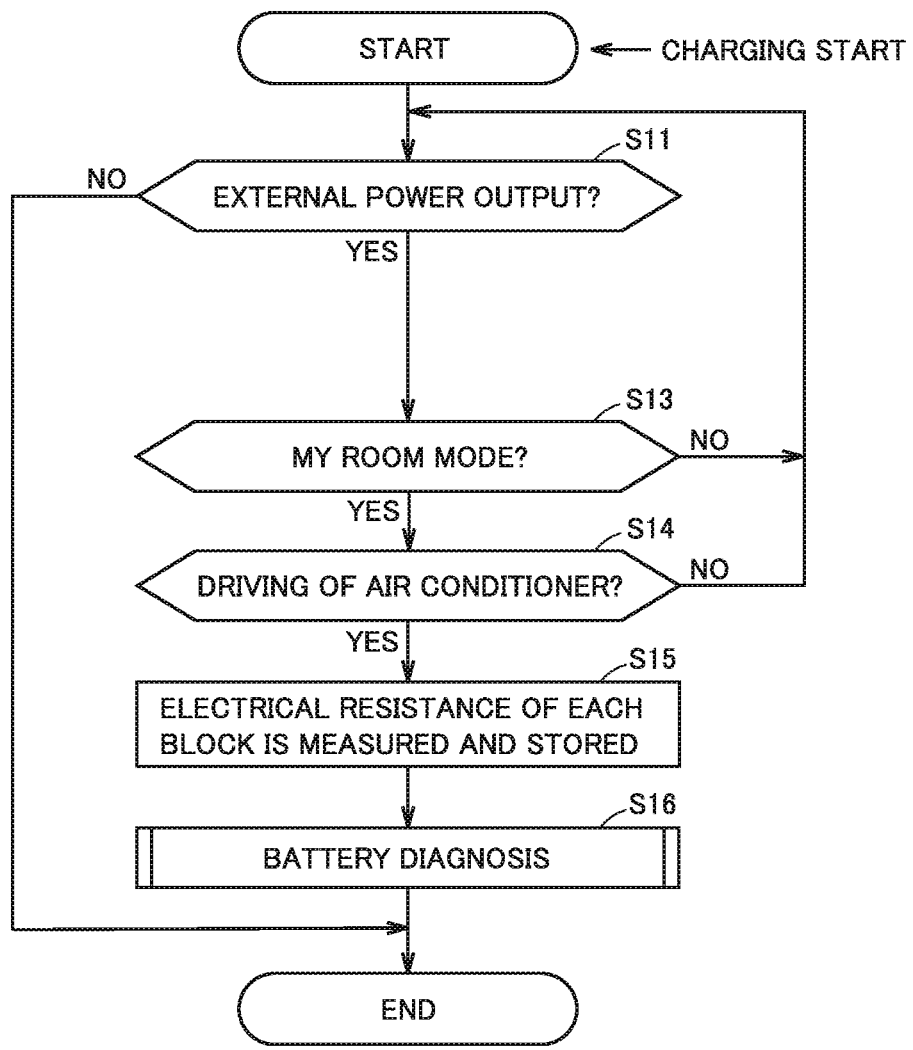

BATTERY RESISTANCE MEASUREMENT DEVICE, VEHICLE AND BATTERY RESISTANCE MEASUREMENT METHOD

This nonprovisional application is based on Japanese Patent Application No. 2021-040348 filed on Mar. 12, 2021 with the Japan Patent Office, the entire contents of which are hereby incorporated by reference.

BACKGROUND

Field

The present disclosure relates to a battery resistance measurement device, a vehicle, and a battery resistance measurement method.

Description of the Background Art

Japanese Patent Laying-Open No. 2004-031170 discloses a method of calculating an internal resistance of a secondary battery mounted on a vehicle while the vehicle is traveling. In this method, during traveling of a vehicle in which charging and discharging of a secondary battery are frequently performed, a polarization state (a degree of influence of polarization), a voltage, and a current of the secondary battery are repeatedly acquired, data (a voltage and a current) having a small degree of influence of polarization is selected, and an internal resistance of the secondary battery is calculated using only data (a voltage and a current) having a small degree of influence of polarization.

SUMMARY

However, in the battery resistance measurement method described in Japanese Patent Laying-Open No. 2004-031170, it is considered necessary to measure the polarization state of the secondary battery with high accuracy in order to select data (voltage and current) having a small degree of influence of polarization. In order to measure the polarization state of the secondary battery with high accuracy, the calculation processing load is considered to be large.

The present disclosure was made to solve the problem above, and an object thereof is to provide a battery resistance measurement device, a vehicle, and a battery resistance measurement method capable of simply and accurately measuring an electric resistance of a battery.

A battery resistance measurement device according to a first aspect of the present disclosure is a battery resistance measurement device that measures an electrical resistance of a target battery and comprises a determination unit and a measurement unit described below.

The determination unit determines, based on whether a predetermined condition is satisfied, whether a target battery has switched from a charged state to a discharged state in which while the target battery receives supplied electric power the target battery outputs electric power larger than the supplied electric power. The measurement unit starts measuring the electrical resistance of the target battery at a time when the determination unit determines that the target battery is switched from the charged state to the discharged state.

Hereinafter, a discharged state of a battery that, while receiving supplied electric power, outputs electric power larger than the supplied electric power will also be referred to as a "discharged state (while receiving electric power)."

A time when it is determined that the battery is switched from the charged state to the discharged state (while receiving electric power) may be referred to as a "timing of switching from charging to discharging."

At a time when the target battery is switched from charging to discharging, polarization caused while the target battery is charged is canceled by discharging of the target battery and thus reduced. Further, at the time when the target battery is switched from charging to discharging, the electric power supplied to the target battery and the electric power output from the target battery are generally equal to each other. Therefore, when measuring the electrical resistance of the target battery is started at the time when the target battery is switched from charging to discharging, it is easy to measure the electrical resistance of the target battery for a period of time for which the battery's current is a small current. For the period of time for which the battery's current is a small current, polarization has a reduced effect, and the battery's voltage and current have a relationship close to a linear relationship. By measuring the electrical resistance of the target battery during such a period of time, it is easy to measure the electrical resistance of the target battery with high accuracy. On the other hand, when the battery's current is a large current, the battery's voltage and current have a relationship which tends to be a non-linear relationship, and the battery's resistance tends to be measured with reduced accuracy.

Thus, the battery resistance measurement device can measure the electrical resistance of the target battery while polarization has a small effect. Therefore, the electrical resistance of the battery can be measured with sufficient accuracy even if the battery's polarization state is measured with low accuracy or the battery's polarization state is not measured. In this way, the battery resistance measurement device can easily and accurately measure the electrical resistance of the battery.

The battery resistance measurement device may further comprise a diagnosis unit. The target battery may be an assembled battery including a plurality of parallel cell blocks. The plurality of parallel cell blocks may each include a plurality of secondary batteries connected in parallel. The plurality of parallel cell blocks may be connected in series to one another. The measurement unit may measure an electrical resistance of at least one parallel cell block included in the assembled battery. The diagnosis unit may diagnose, based on an electrical resistance of a target block, whether the target block is disconnected, the target block being any parallel cell block included in the assembled battery.

In the target battery, disconnection (including a fused fuse and loosened fastening) may interrupt electrical connection in a portion of a parallel cell block and a secondary battery may be separated from the parallel cell block. When a parallel cell block has separated therefrom at least one of a plurality of secondary batteries connected in parallel, the electrical resistance of the parallel cell block increases. Therefore, the diagnosis unit can accurately diagnose whether the target block is disconnected based on the electrical resistance of the target block.

The diagnosis unit may diagnose, based on a degree of deviation between the electrical resistance of the target block and an electrical resistance of a parallel cell block located adjacent to the target block in the assembled battery, whether the target block is disconnected.

Hereinafter, a parallel cell block located adjacent to the target block in the assembled battery will also be referred to as a "neighboring block."

The diagnosis unit diagnoses whether the target block is disconnected by using a degree of deviation between the electrical resistance of the target block and the electrical resistance of the neighboring block (hereinafter, also referred to as a "resistance deviation degree"). For a large resistance deviation degree, it is believed that a disconnection is caused in either one of the target block and a neighboring block that is a parallel cell block having a large electrical resistance. As a parameter indicating a degree of deviation, for example, a difference or a ratio can be employed. The greater the difference (in absolute value) between the two is, the greater the degree of deviation therebetween will be. As the ratio between the two is closer to 1, the degree of deviation between the two will be smaller. The resistance deviation degree may be a ratio between the electrical resistance of the target block and the electrical resistance of the neighboring block.

The diagnosis unit may determine that a disconnection is caused in the target block (and the neighboring block has no disconnection) when the resistance deviation degree is greater than a predetermined level and the electrical resistance of the target block is greater than the electrical resistance of the neighboring block. The diagnosis unit may determine that a disconnection is caused in the neighboring block (and the target block has no disconnection) when the resistance deviation degree is greater than a predetermined level and the electrical resistance of the neighboring block is greater than the electrical resistance of the target block.

The measurement unit may measure an electrical resistance of each parallel cell block included in the assembled battery. The diagnosis unit may sequentially change the target block to diagnose, based on the electrical resistance of each parallel cell block measured by the measurement unit, whether there is disconnection in the assembled battery. According to such a configuration, whether the assembled battery has disconnection can be accurately diagnosed.

The measurement unit may measure a current and a voltage while the target battery discharges electric power, and the measurement unit measures the electrical resistance of the target battery based on the measured current and voltage.

When measuring the electrical resistance of the target battery is started at a time when charging is switched to discharging, a current and a voltage while the target battery is discharged, as measured by the measurement unit, has a relationship which is close to a linear relationship. Therefore, the measurement unit can easily measure the electrical resistance of the target battery (e.g., the internal resistance of the secondary battery) with high accuracy, based on the measured current and voltage.

A vehicle according to a second aspect of the present disclosure comprises: the battery resistance measurement device according to any one of the above items; the target battery; an auxiliary device that receives electric power from the target battery; and a control device that switches a plurality of types of control modes. The plurality of types of control modes include: a prohibition mode which prohibits driving the auxiliary device with electric power output from the target battery when the target battery receives electric power from outside the vehicle; and a permission mode which permits driving the auxiliary device with electric power output from the target battery when the target battery receives electric power from outside the vehicle. The predetermined condition in the battery resistance measurement device includes a condition that that the control device is executing the permission mode (hereinafter also referred to as a "requirement A") and a condition that that the auxiliary device is driven after charging the target battery with electric power supplied from outside the vehicle is started (hereinafter also referred to as a "requirement B").

In the vehicle, the control device can switch the prohibition mode to the permission mode and vice versa. The control device can apply the prohibition mode so that while the target battery is charged, using a predetermined auxiliary device is prohibited so that charging the target battery proceeds faster. Further, the control device can apply the permission mode to permit using the predetermined auxiliary device to improve convenience for the user. The control device may switches between the prohibition mode and the permission mode in response to an input from the user.

In the vehicle, the predetermined auxiliary device, which is permitted to be driven in the permission mode, is driven by electric power output from the target battery. The predetermined auxiliary device may include an auxiliary device with large electric power consumption (e.g., an air conditioner or various heaters). When the target battery is receiving electric power from outside the vehicle, and the auxiliary device with large electric power consumption is driven, electric power larger than that supplied to the target battery is easily output from the target battery. Therefore, when the requirements A and B are both satisfied, the target battery is easily switched from the charged state to the discharged state (while receiving electric power). Therefore, in the vehicle, the determination unit easily, accurately determines, based on whether the predetermined condition is satisfied, whether the target battery is switched from the charged state to the discharged state (while receiving electric power).

In the vehicle, the requirements A and B are requirements required to establish the predetermined condition, and when at least one of the requirements A and B is not satisfied, the predetermined condition is not established. The predetermined condition may be established when the requirements A and B are both satisfied, or may be established when another requirement (an additional requirement) is satisfied in addition to the requirements A and B. The additional requirement in addition to the requirements A and B can be set as desired.

In the vehicle, the battery resistance measurement device and the control device may be two divided units or a common unit (that is, a single unit having both functions of the battery resistance measurement device and the control device.).

The auxiliary device that receives electric power from the target battery may be an air conditioner that performs air conditioning for an interior of the vehicle.

Generally, an air conditioner consumes large electric power. Therefore, when the target battery receives electric power from outside the vehicle, and the air conditioner is driven by electric power supplied from the target battery, electric power larger than the electric power supplied to the target battery is easily output from the target battery.

The target battery mounted in the vehicle may store electric power in the vehicle for traveling. The vehicle may be an electrically driven vehicle. The electrically driven vehicle is a vehicle configured to travel using electric power supplied from a battery (e.g., the target battery) mounted in the vehicle. The electrically driven vehicle includes a BEV (a battery electric vehicle) and a PHEV (plug-in hybrid electric vehicle), and also includes an FCEV (fuel cell electric vehicle), a range extender BEV, and the like.

The control device may set an input limit value depending on the temperature of the target battery and control a current input to the target battery so that the target battery does not receive electric power exceeding the input limit value. The control device may set the input limit value such that a first value is lower than a second value. The first value is the input limit value when the temperature of the target battery is lower than a predetermined temperature, and the second value is the input limit value when the temperature of the target battery is higher than the predetermined temperature. The predetermined condition in the battery resistance measurement device may further include a condition that the temperature of the target battery is lower than the predetermined temperature (hereinafter also referred to as a "requirement C").

In the vehicle, the control device controls a current input to the target battery so that the target battery does not receive electric power exceeding the input limit value. The input limit value may be set to suppress degradation of the target battery. In the vehicle, the input limit value is set depending on the temperature of the target battery. When the temperature of the target battery is lower than a predetermined temperature, the input limit value becomes low. The electric power supplied to the target battery is limited by the input limit value, and when the input limit value is low, and the auxiliary device is driven, the electric power output from the target battery tends to be larger than the electric power supplied to the target battery. Therefore, when the requirements A to C are all satisfied, the target battery tends to be switched from the charged state to the discharged state (while receiving electric power). In the vehicle, the determination unit easily, accurately determines, based on whether the predetermined condition is established, whether the target battery is switched from the charged state to the discharged state (while receiving electric power).

In the vehicle, the requirements A to C are each a requirement required to establish the predetermined condition, and when at least one of the requirements A to C is not satisfied, the predetermined condition is not established. The predetermined condition may be established when the requirements A to C are satisfied, or may be established when another requirement (an additional requirement) is satisfied in addition to the requirements A to C. The additional requirement in addition to the requirements A to C can be set as desired.

The target battery may include a lithium ion secondary battery. The control device may sets an input limit value so that lithium metal is not precipitated on the negative electrode of the lithium ion secondary battery.

In the vehicle, precipitation of lithium metal on the negative electrode of the lithium ion secondary battery can be suppressed by the input limit value.

A battery resistance measurement method according to a third aspect of the present disclosure is a battery resistance measurement method for measuring an electrical resistance of a target battery, the method comprising: determining, based on whether a predetermined condition is satisfied, whether a target battery has switched from a charged state to a discharged state in which while the target battery receives supplied electric power the target battery outputs electric power larger than the supplied electric power; and starting to measure the electrical resistance of the target battery when it is determined that the target battery is switched from the charged state to the discharged state.

The battery resistance measurement method, as well as the battery resistance measurement device described above, allows a battery's electrical resistance to be easily and accurately measured.

The foregoing and other objects, features, aspects and advantages of the present disclosure will become more apparent from the following detailed description of the present disclosure when taken in conjunction with the accompanying drawings.

BRIEF DESCRIPTION OF THE DRAWINGS

FIG. 15 is a diagram showing a modified example of the process shown in FIG. 13.

DESCRIPTION OF THE PREFERRED EMBODIMENTS

Figure 1:
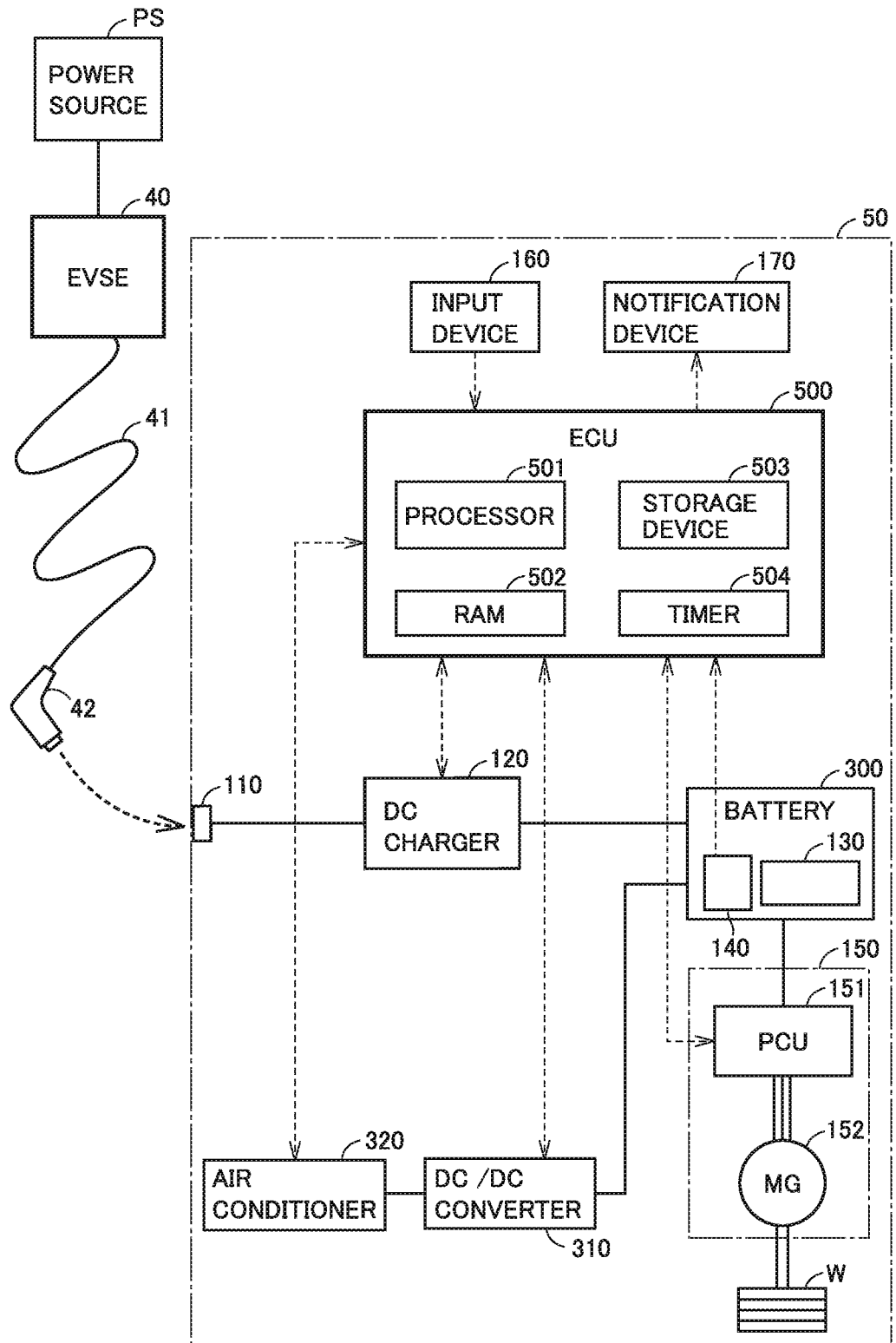
FIG. 1 is a diagram showing a schematic configuration of a vehicle according to an embodiment of the present disclosure.

Embodiments of the present disclosure will be described in detail with reference to the drawings. In the drawings, the same or corresponding portions are denoted by the same reference numerals, and the description thereof will not be repeated. Each step in the flowchart is simply denoted as "S". An electronic control unit may be referred to as an "ECU". An electric vehicle supply equipment may be referred to as "EVSE".

FIG. 1 is a diagram showing a schematic configuration of a vehicle according to this embodiment. Referring to FIG. 1, vehicle 50 includes a battery 300 that stores electric power for traveling, and an ECU 500 that controls charging and discharging of battery 300. The vehicle 50 may be a battery electric vehicle (BEV) that can travel using only the electric power stored in the battery 300, or a plug-in hybrid electric vehicle (PHEV) that can travel using both the electric power stored in the battery 300 and the output of an engine (not shown).

In this embodiment, the battery 300 includes an assembled battery 130. The assembled battery 130 is configured by electrically connecting a plurality of secondary batteries (hereinafter also referred to as "cells") to each other. In this embodiment, a lithium ion secondary battery is employed as the cell. However, the cell may be a secondary battery other than a lithium ion secondary battery (for example, a nickel-hydrogen battery). The cell may be a liquid secondary battery or an all-solid secondary battery. The assembled battery 130 corresponds to an example of the "target battery" according to the present disclosure. A specific configuration of the assembled battery 130 will be described later (see FIG. 2).

The battery 300 further includes a monitoring module 140 for monitoring the state of the assembled battery 130. The monitoring module 140 includes a battery sensor for detecting a state of the assembled battery 130 and a signal processing circuit for processing an output signal of the battery sensor, and outputs a sensor signal processed by the signal processing circuit to the ECU 500. In this embodiment, a voltage sensor, a current sensor, and a temperature sensor which detect the voltage, current, and temperature of the assembled battery 130 are employed as the battery sensor. As the signal processing circuit, for example, a general-purpose IC (integrated circuit) can be employed. The ECU 500 can acquire the state of the assembled battery 130 (For example, temperature, current, voltage, SOC (State Of Charge), and internal resistance) based on the output of the monitoring module 140. A specific configuration of the monitoring module 140 will be described later (see FIGS. 2 and 3).

The vehicle 50 includes an inlet 110 for contact charging and a DC charger 120. The inlet 110 and the DC charger 120 correspond to the power supply system of the EVSE 40. In this embodiment, a DC power supply facility for providing DC power is employed as the EVSE 40. EVSE 40 may be a quick charger. The EVSE 40 includes a charging cable 41. The charging cable 41 is connected to the main body of the EVSE 40. The charging cable 41 may be always connected to the main body of the EVSE 40, or may be detachably attached to the main body of the EVSE 40. The charging cable 41 has a connector 42 at its distal end and includes a power line therein. The EVSE 40 receives power from the power source PS and outputs DC power to the connector 42. The power source PS may be a power grid provided by an electric utility, such as an electric power company. The power source PS may provide AC power to the EVSE 40. After converting AC power into DC power, EVSE 40 may output DC power to connector 42.

The inlet 110 is configured to be connectable to the connector 42 of the charging cable 41. The DC charger 120 is located between the inlet 110 and the battery 300 and includes a circuit corresponding to the DC power supply facility. The DC charger 120 includes, for example, a filter circuit and a charging relay. The charging relay is configured to switch the connection/disconnection of the power path from the inlet 110 to the battery 300. The inlet 110 is configured to receive electric power supplied from the outside of the vehicle 50 and to output the electric power to the DC charger 120. The DC charger 120 is configured to convert the power received by the inlet 110 into power suitable for charging the battery 300, and to output the converted power to the battery 300.

The connector 42 of the charging cable 41 connected to the main body of the EVSE 40 is connected (plugged-in) to the inlet 110 of the vehicle 50 in a parked state, whereby the vehicle 50 enters a chargeable state (i.e., a state in which power is supplied from the EVSE 40). In the vehicle 50 in the chargeable state, external charging (That is, the battery 300 is charged by the power supplied from the EVSE 40.) is enabled. When external charging is executed, the charging relay is brought into a closed state (connected state), and when external charging is not executed, the charging relay is brought into an open state (cutoff state).

Although FIG. 1 shows only the inlet 110 and the DC charger 120 corresponding to the power supply method of the EVSE 40, the vehicle 50 may include a plurality of inlets and chargers so as to be compatible with a plurality of types of power supply methods (e.g., AC method and DC method).

The ECU 500 includes a processor 501, a RAM (Random Access Memory) 502, a storage device 503, and a timer 504. The ECU 500 is, for example, a microcomputer. As the processor 501, for example, a CPU (Central Processing Unit) can be employed. The RAM 502 functions as a working memory for temporarily storing data to be processed by the processor 501. The storage device 503 is configured to be able to store the inputted information. The storage device 503 includes, for example, a ROM (Read Only Memory) and a rewritable nonvolatile memory. The storage device 503 stores, in addition to programs, information (e.g., maps, mathematical expressions, and various parameters) used in the programs. In this embodiment, the processor 501 executes a program stored in the storage device 503 to execute various controls in the ECU 500. However, various controls in ECU 500 are not limited to execution by software, and may be executed by dedicated hardware (electronic circuit). The number of processors included in ECU 500 is arbitrary, and processors may be prepared for each predetermined control.

The timer 504 is configured to inform the processor 501 of the arrival of a set time. At the time set in the timer 504, the timer 504 transmits a signal indicating the time to the processor 501. In this embodiment, a timer circuit is employed as the timer 504. However, the timer 504 may be realized by software instead of hardware (timer circuit). The ECU 500 can acquire the current time using a real-time clock (RTC) circuit (not shown) built in the ECU 500.

The vehicle 50 further includes a travel driving unit 150, an input device 160, a notification device 170, and driving wheels W. Although only one drive wheel W is shown in FIG. 1, the vehicle 50 includes four wheels (including the drive wheel W). However, the number of wheels of the vehicle 50 is arbitrary, and may be three or five or more. The driving method of the vehicle 50 is also arbitrary, and may be any of front wheel driving, rear wheel driving, and four wheel driving.

The travel driving unit 150 includes a power control unit (PCU) 151 and a Motor Generator (MG) 152, and is configured to travel the vehicle 50 using electric power stored in the assembled battery 130. The PCU 151 includes, for example, an inverter, a converter, and a relay (Hereinafter, this is referred to as "SMR (System Main Relay)".) (none of which are shown). The PCU 151 is controlled by the ECU 500. MG 152 is, for example, a three-phase AC motor generator. The MG 152 is driven by the PCU 151 and is configured to rotate the drive wheel W. The PCU 151 drives the MG 152 using electric power supplied from the assembled battery 130. The MG 152 is configured to perform regenerative power generation and supply the generated power to the assembled battery 130. The SMR is configured to switch the connection/disconnection of the power path from the assembled battery 130 to the MG 152. The SMR is brought into a closed state (connected state) when the vehicle 50 travels.

The input device 160 is a device that accepts an input from a user. Input device 160 is operated by the user and outputs a signal corresponding to the user's operation to ECU 500. The communication method may be wired or wireless. Examples of the input device 160 include various switches, various pointing devices, a keyboard, and a touch panel. The input device 160 may be an operation unit of the car navigation system. The input device 160 may be a smart speaker that accepts audio input.

The notification device 170 is configured to perform a predetermined notification process to a user (for example, an occupant of the vehicle 50) when a request is received from the ECU 500. The notification device 170 may include at least one of a display device (e.g., a touch panel display), a speaker, and a lamp (e.g., an MTh (fault warning light)). The notification device 170 may be a meter panel, a head-up display, or a car navigation system.

The vehicle 50 further includes a DC/DC converter 310 and an air conditioner 320. The air conditioner 320 is configured to perform air conditioning of the vehicle compartment of the vehicle 50. The air conditioner 320 includes an electric compressor (not shown) for air conditioning. The user of the vehicle 50 can operate the input device 160 to cause the air conditioner 320 to perform heating or cooling of the vehicle compartment. The DC/DC converter 310 is located between the battery 300 and the air conditioner 320, and is configured to cut off or convert DC power supplied from the battery 300 to the air conditioner 320. The DC/DC converter 310 is controlled by the ECU 500. In the control of supplying the electric power of the battery 300 to the air conditioner 320, the ECU 500 connects a power supply path from the battery 300 to the air conditioner 320. The DC power output from the battery 300 is converted into a predetermined DC power by the DC/DC converter 310 and supplied to the air conditioner 320.

The ECU 500 is configured to switch a plurality of control modes. The control modes include a normal mode and a my room mode. The normal mode is a control mode in which, when the assembled battery 130 receives power from the DC charger 120, driving of a predetermined auxiliary device (hereinafter referred to as "target auxiliary device") by the power output from the assembled battery 130 is prohibited. The mild mode is a control mode in which when the assembled battery 130 receives power from the DC charger 120, the target auxiliary device is permitted to be driven by the power output from the assembled battery 130. In this embodiment, the target auxiliary device is the air conditioner 320. The auxiliary device of the vehicle 50 is a load that consumes electric power in a vehicle other than electric driving. In the vehicle 50, each of the ECU 500, the notification device 170, and the air conditioner 320 corresponds to an auxiliary device. Each of the ECU 500 and the notification device 170 is supplied with electric power from an auxiliary battery (not shown). On the other hand, the MG 152 (driving motor) that generates power for electric driving does not correspond to an auxiliary machine. The normal mode and the my room mode correspond to examples of the "prohibited mode" and the "permitted mode" according to the present disclosure, respectively. The air conditioner 320 corresponds to an example of the "auxiliary machine" according to the present disclosure.

The ECU 500 switches between the normal mode and the my room mode in response to an input from the user of the vehicle 50. The user can instruct the ECU 500 to switch the control mode through the input device 160. When external charging of the assembled battery 130 is performed, power is supplied from the EVSE 40 (outside the vehicle) to the DC charger 120 through the inlet 110, and the DC charger 120 outputs the power to the assembled battery 130. When the assembled battery 130 receives power from the DC charger 120, in principle, the ECU 500 executes the normal mode and prohibits the air conditioner 320 from being driven by the power output from the assembled battery 130. However, when the user instructs the ECU 500 to execute the my room mode, the ECU 500 executes the my room mode instead of the normal mode. This allows the air conditioner 320 to be driven by the electric power output from the assembled battery 130. In the normal mode, during external charging of the assembled battery 130, a power supply path from the battery 300 to the air conditioner 320 is cut off by the DC/DC converter 310. On the other hand, in the my room mode, the electric power of the battery 300 is supplied to the air conditioner 320 even during external charging of the assembled battery 130.

Figure 2:
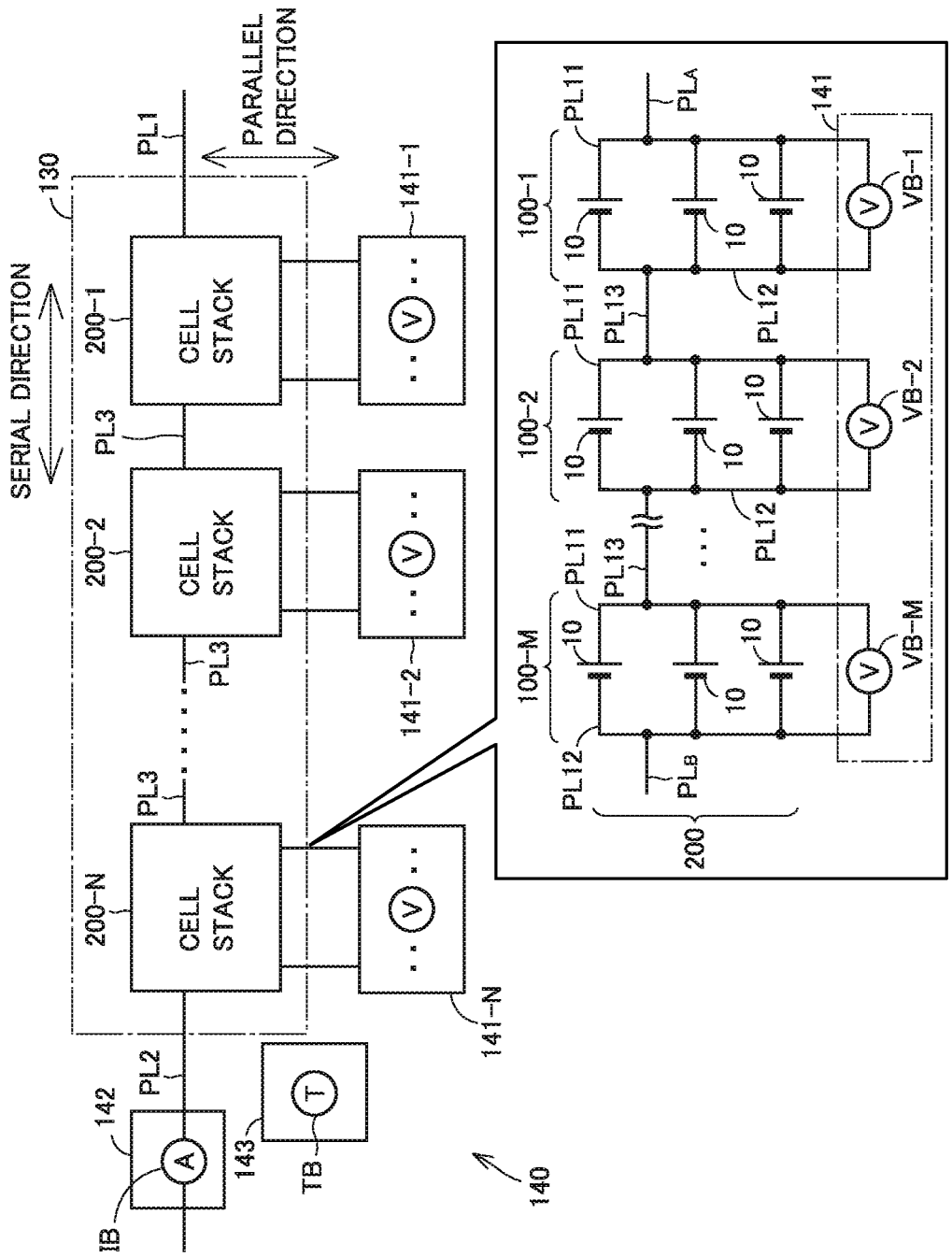
FIG. 2 is a diagram showing a configuration of each of an assembled battery and a monitoring module included in the battery shown in FIG. 1.

FIG. 2 is a diagram showing a configuration of each of the assembled battery 130 and the monitoring module 140 included in the battery 300. Referring to FIG. 2 together with FIG. 1, assembled battery 130 includes N cell stacks (i.e., cell stacks 200-1 to 200-N). N may be 5 or more or 30 or more. In this embodiment, N is 10. The monitoring module 140 includes N voltage detection circuits (i.e., voltage detection circuits 141-1 to 141-N), one current detection circuit 142, and one temperature detection circuit 143.

The current detection circuit 142 includes a current sensor IB for detecting currents flowing through the cell stacks 200-1 to 200-N. The current detection circuit 142 is configured to process the output signal of the current sensor IB. A temperature sensor TB for detecting the temperature of the assembled battery 130 is mounted on the temperature detection circuit 143. The temperature detection circuit 143 is configured to process the output signal of the temperature sensor TB. In this embodiment, the number of current sensors IB and temperature sensors TB included in the monitoring module 140 is one. However, the number of current sensors IB and temperature sensors TB is not limited to this, and the number of current sensors IB and temperature sensors TB can be changed as appropriate. For example, the temperature sensor TB may be provided for each cell stack, each parallel cell block, or each cell.

The voltage detection circuits 141-1 to 141-N are provided in the cell stacks 200-1 to 200-N, respectively. Hereinafter, unless they are described in a distinguished manner, each of the cell stacks 200-1 to 200-N will be referred to as a "cell stack 200", and each of the voltage detection circuits 141-1 to 141-N will be referred to as a "voltage detection circuit 141". Hereinafter, the configurations of the cell stack 200 and the voltage detection circuit 141 will be described. In this embodiment, each of the cell stacks 200-1 to 200-N has the same configuration (that is, the detailed configuration of the cell stack 200 shown in FIG. 2).

The cell stack 200 includes M parallel cell blocks (i.e., parallel cell blocks 100-1 to 100-M). M voltage sensors (that is, voltage sensors VB-1 to VB-M) are mounted on one voltage detection circuit 141. The voltage sensors VB-1 to VB-M are configured to detect the inter-terminal voltages of the parallel cell blocks 100-1 to 100-M, respectively. M may be 5 or more or 30 or more. In this embodiment, M is 10.

The parallel cell blocks 100-1 to 100-M are connected in series via a power line PL13. Each power line PL13 connects adjacent parallel cell blocks in series in the cell stack 200. The power lines PLA and PLB are power lines for connecting the cell stack 200 to the outside. In this embodiment, the power line PLA is a power line on the positive side of the cell stack 200, and the power line PLB is a power line on the negative side of the cell stack 200. Hereinafter, unless they are described in a distinguished manner, each of the parallel cell blocks 100-1 to 100-M will be referred to as a "parallel cell block 100".

Each parallel cell block 100 includes a plurality of cells 10 (in this embodiment, lithium ion secondary batteries) connected in parallel. Although the number of cells 10 included in each parallel cell block 100 is arbitrary, it is three in this embodiment. In each parallel cell block 100, the positive electrodes of the three cells 10 are connected in parallel by a power line PL11, and the negative electrodes of the three cells 10 are connected in parallel by a power line PL12. Each of the power lines PL11 and PL12 may be a wire or a metal plate (e.g., a bus bar). Each cell 10 included in the parallel cell block 100 may be connected to the power line PL11 or PL12 via a fuse (not shown).

In this embodiment, each parallel cell block 100 includes the same number (more specifically, three) of cells 10. However, the number of cells included in one parallel cell block is not limited to three and may be arbitrary. For example, each parallel cell block may include five or more cells. The number of cells may be different for each parallel cell block.

The cell stacks 200-1 to 200-N are connected in series via a power line PL3 to form an assembled battery 130. The assembled battery 130 includes N×M parallel cell blocks 100. The number of parallel cell blocks included in the assembled battery 130 may be 50 or more, or 100 or more. In this embodiment, the number of parallel cell blocks included in the assembled battery 130 is 100. The capacity of the assembled battery 130 may be 30 Ah or more or 100 Ah or more.

The power lines PL1 and PL2 are power lines for connecting the assembled battery 130 and the outside. In this embodiment, the power line PL1 is a power line on the positive electrode side of the assembled battery 130, and the power line PL2 is a power line on the negative electrode side of the assembled battery 130. The power line PL1 corresponds to the power line PLA of the cell stack 200-1. The power line PL2 corresponds to the power line PLB of the cell stack 200-N. In this embodiment, the current sensor IB is arranged on the power line PL2. However, the current sensor IB may be arranged on the power line PL1. The current sensor IB detects the total current flowing through all the cells 10 constituting each parallel cell block 100.

Figure 3:
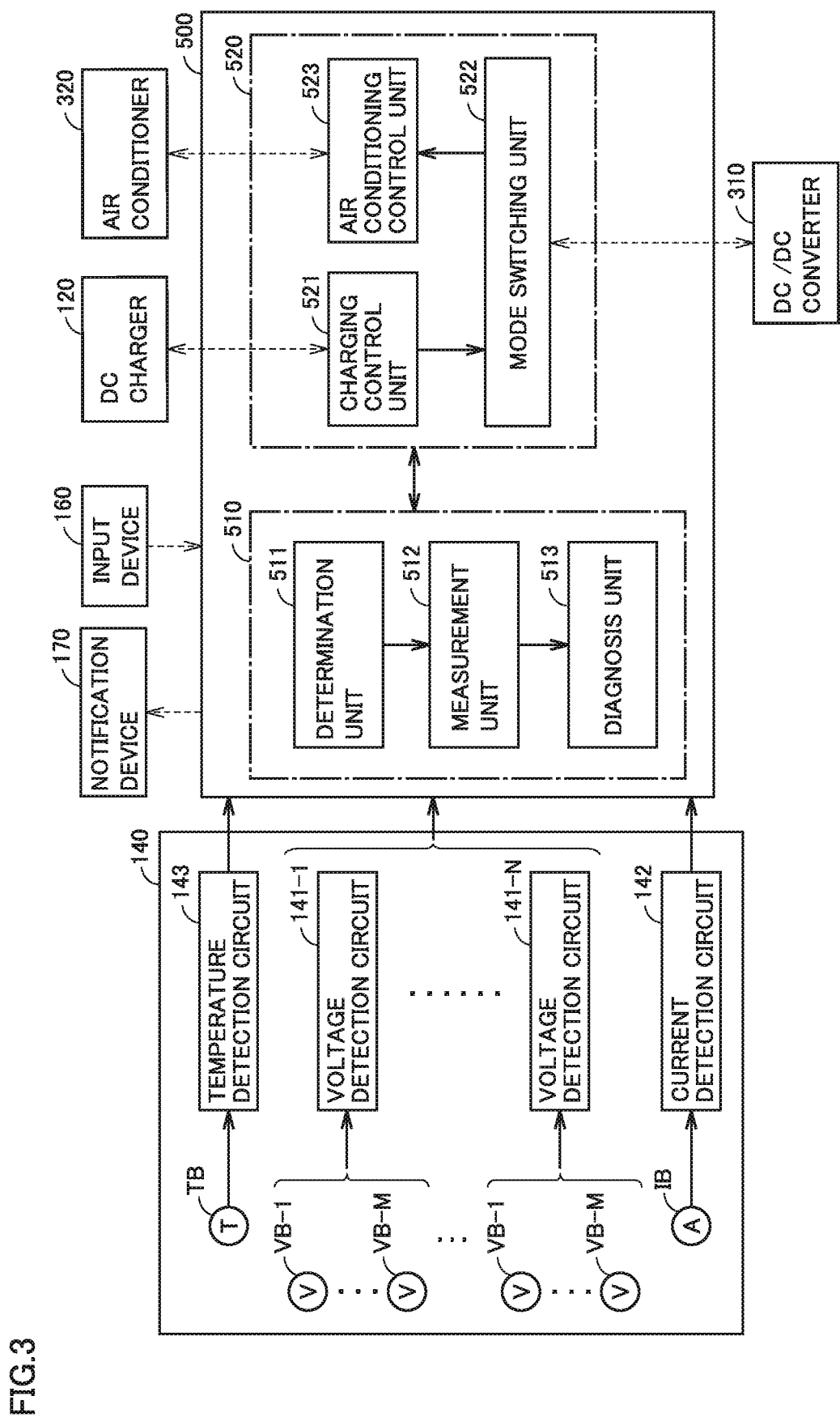
FIG. 3 is a diagram showing a detailed configuration of a vehicle control apparatus shown in FIG. 1.

FIG. 3 is a diagram showing a detailed configuration of the ECU 500. Referring to FIG. 3 together with FIGS. 1 and 2, ECU 500 includes a battery resistance measurement system 510 and a control system 520. In ECU 500, battery resistance measurement system 510 functions as an example of the "battery resistance measurement device" according to the present disclosure, and control system 520 functions as an example of the "control device" according to the present disclosure.

The battery resistance measurement system 510 includes a determination unit 511, a measurement unit 512, and a diagnosis unit 513. The control system 520 includes a charging control unit 521, a mode switching unit 522, and an air conditioning control unit 523. In this embodiment, these units are embodied by the processor 501 shown in FIG. 1 and a program executed by the processor 501. This is not exclusive, however, each unit may be embodied by dedicated hardware (electronic circuit).

The ECU 500 acquires the state of the assembled battery 130 from the monitoring module 140. The output signals of the voltage sensors VB-1 to VB-M are input to the ECU 500 via a voltage detection circuit 141 which is a circuit common to these sensors. That is, each of the voltage detection circuits 141 processes the M sensor signals and outputs the M sensor signals to the ECU 500. An output signal of the current sensor IB is input to the ECU 500 via the current detection circuit 142. An output signal of the temperature sensor TB is input to the ECU 500 via the temperature detection circuit 143.

The charging control unit 521 is configured to control the input current of the assembled battery 130 so that the input power of the assembled battery 130 does not exceed the input limit value. The charging control unit 521 is configured to acquire the temperature of the assembled battery 130 from the temperature detection circuit 143 and set an input limit value in accordance with the temperature of the assembled battery 130. Hereinafter, the input limit value may be referred to as "Win". The charging control unit 521 according to this embodiment sets Win based on a map shown in FIG. 4.

Figure 4:
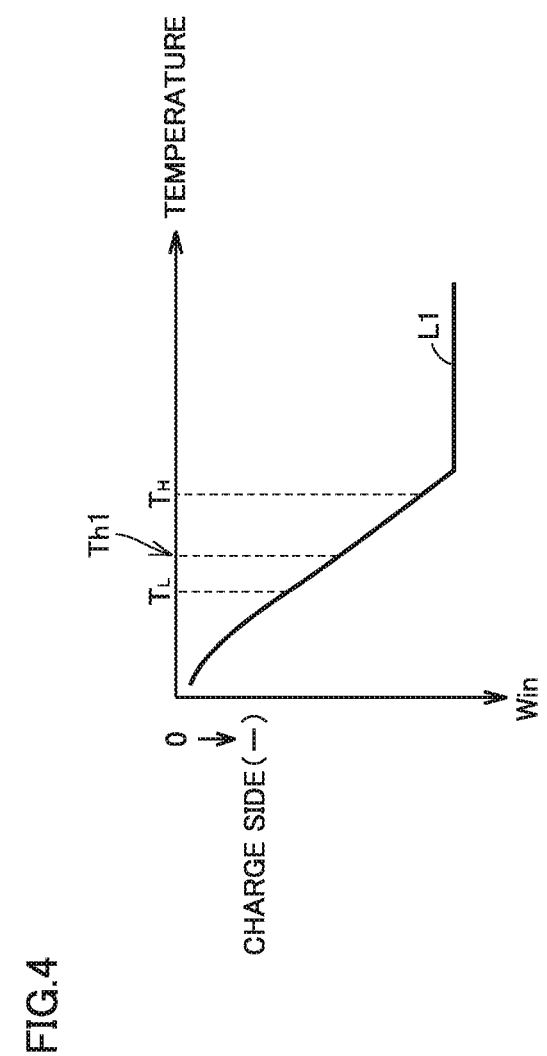
FIG. 4 is a diagram showing a map defining the relationship between the temperature of the assembled battery shown in FIG. 2 and the input limit value (Win).

FIG. 4 is a diagram showing a map defining the relationship between the temperature of the assembled battery 130 and Win. In this embodiment, the electric power on the discharge side is represented by positive (+), and the electric power on the charge side is represented by negative (−). However, when the magnitude of the power is compared, the magnitude of the power is compared by an absolute value regardless of the sign (+/−). That is, the power whose value is closer to 0 is smaller.

Referring to FIG. 4, the map indicated by line L1 defines the relationship between the temperature of assembled battery 130 and Win. According to this map, Win becomes greater toward the negative side as the temperature of the assembled battery 130 becomes higher in the low temperature region, and Win becomes substantially constant when the temperature of the assembled battery 130 becomes higher than that in the low temperature region. This map defines Win for each temperature of the assembled battery 130 so that lithium metal is not deposited on the negative electrode of the lithium ion secondary battery (cell 10) included in the assembled battery 130. By using the map, the charging control unit 521 can set Win so that lithium metal is not deposited on the negative electrode of the lithium ion secondary battery. The charging control unit 521 sets Win (input limit value) in accordance with the map so that Win when the temperature of the assembled battery 130 is lower than Th1 is lower than Win when the temperature of the assembled battery 130 is higher than Th1. In FIG. 4, Th1 corresponds to an example of the "predetermined temperature" according to the present disclosure. The temperatures $T_L$ and $T_H$ shown in FIG. 4 will be described later.

Referring again to FIGS. 1 and 2 and FIG. 3, the charging control unit 521 controls the input current of the assembled battery 130 so that the input power of the assembled battery 130 does not exceed Win set based on the map. The charging control unit 521 can adjust the input current of the assembled battery 130 by controlling the DC charger 120, for example. Note that the fact that the input power exceeds Win means that the input power becomes larger toward the negative side than Win (that is, becomes farther toward the negative side than 0). Although only the input limit value (Win) is shown in FIG. 4, the output limit value (the upper limit value of the output power) of the assembled battery 130 may be set in addition to the input limit value (the upper limit value of the input power) of the assembled battery 130.

The mode switching unit 522 is configured to execute switching of the control mode described above. The mode switching unit 522 executes, for example, a process shown in FIG. 5 described below.

Figure 5:
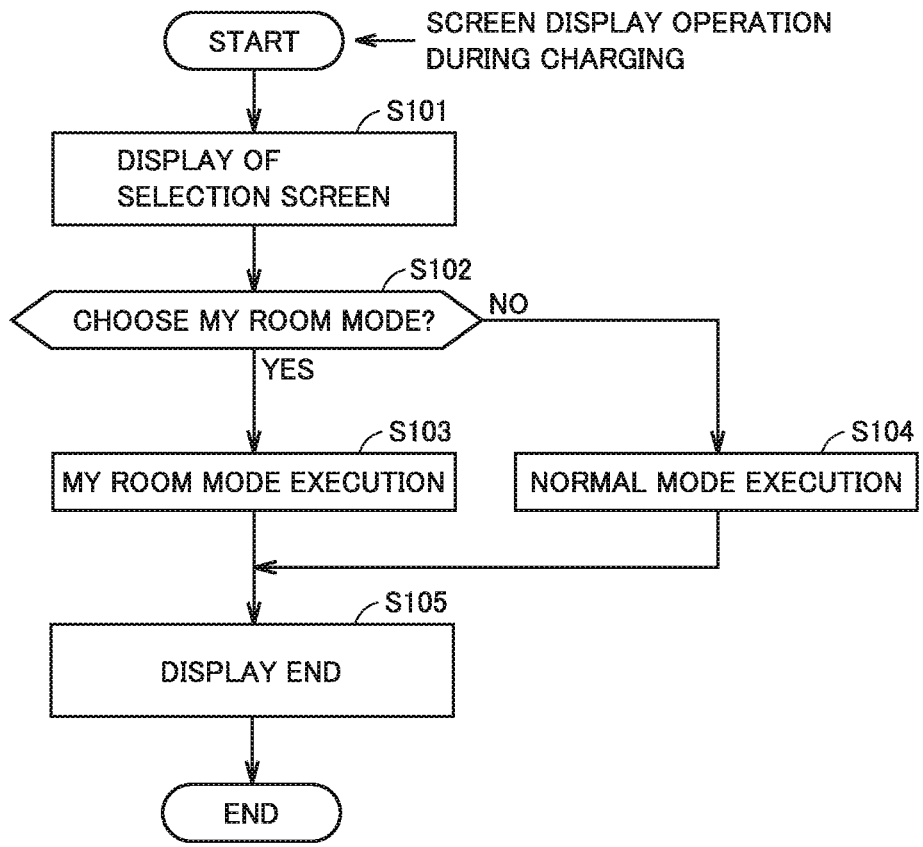
FIG. 5 is a flowchart showing a process related to switching of a control mode executed by the vehicle control apparatus shown in FIG. 1.

FIG. 5 is a flowchart showing a process related to switching of a control mode executed by ECU 500. The process shown in this flowchart is started when the user performs a predetermined operation (screen display operation) on the input device 160 during external charging of the assembled battery 130.

Referring to FIG. 5 together with FIGS. 1 to 3, in S101, the mode switching unit 522 controls the notification device 170 so that the notification device 170 displays the selection screen. The selection screen is a screen prompting the user to select a control mode (More specifically, an input for selecting one of the normal mode and the my room mode).

Figure 6:
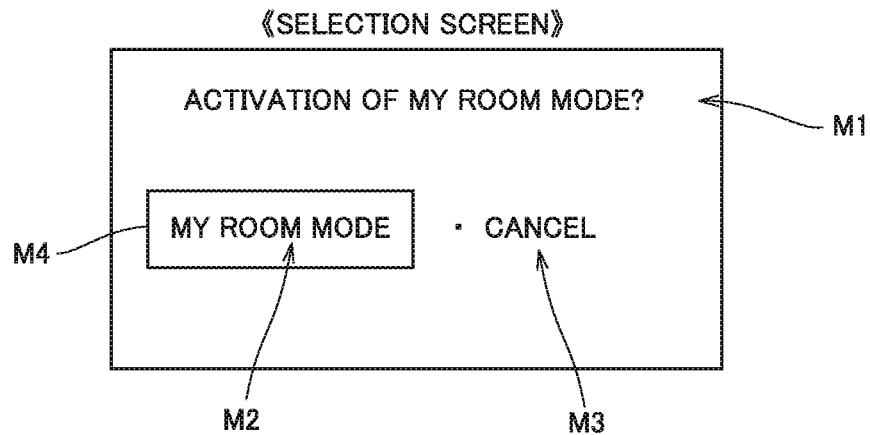
FIG. 6 is a diagram showing an example of a selection screen used in the process shown in FIG. 5.

FIG. 6 is a diagram showing an example of a selection screen. Referring to FIG. 6 together with FIG. 5, this selection screen displays a message M1, an option M2 of "my room mode", an option M3 of "cancel", and a cursor M4, and prompts the user to select one of the options M2 and M3. The user can select one of the options M2 and M3 by operating the input device 160, for example. For example, the input device 160 may include a cursor key (arrow button) and an enter button. The user may select one of the options M2 and M3 by moving the cursor M4 to one of the options M2 and M3 using the cursor key and pressing the enter button.

In S102 of FIG. 5, the mode switching unit 522 determines whether or not the my room mode is selected by the user. When the user selects the option M2 on the selection screen shown in FIG. 6, it is determined YES in S102. On the other hand, if the user selects option M3, NO is determined in S102. Even when a predetermined time (for example, 100 seconds) has elapsed after none of the options M2 and M3 has been selected after the selection screen is displayed in S101, NO is determined in S102.

Referring again to FIGS. 1 to 3 and FIG. 5, when YES is determined in S102, the mode switching unit 522 executes the my room mode in S103. On the other hand, if NO is determined in S102, the mode switching unit 522 executes the normal mode in S104. When the process of S103 or S104 is executed, the mode switching unit 522 ends the display of the selection screen by the notification device 170 in S105. By the process of S105, the notification device 170 may be in a non-display state, or may display a home screen instead of the selection screen. When the process of S105 is executed, the series of processes shown in FIG. 5 ends.

Referring again to FIGS. 1 to 3, the air conditioning control unit 523 is configured to control the air conditioner 320. For example, the input device 160 may include an operation panel of the air conditioner 320. The user can turn on the power of the air conditioner 320 or input a target temperature of the air conditioner 320 through the operation panel. In this embodiment, the air conditioning control unit 523 controls the air conditioner 320 based on an input from the user. However, when the mode switching unit 522 is executing the normal mode during external charging of the assembled battery 130, the air conditioning control unit 523 cannot drive the air conditioner 320. In the normal mode, the mode switching unit 522 controls the DC/DC converter 310 during external charging of the assembled battery 130, and the DC/DC converter 310 cuts off the power supply path from the battery 300 to the air conditioner 320. Thus, use of the air conditioner 320 during external charging of the assembled battery 130 is prohibited.

The determination unit 511 determines whether or not the assembled battery 130 is switched from the charged state to the discharged state (while receiving electric power) based on whether or not a predetermined condition (hereinafter referred to as "measurement start condition") is satisfied. The measurement start condition is set so as to be satisfied when the assembled battery 130 is switched from the charged state to the discharged state (while receiving electric power) after the external charging of the assembled battery 130 is started. The discharged state (while receiving electric power) is a discharged state in which the assembled battery 130 outputs power larger than the supplied power while receiving power.

The measurement start condition includes requirements a to c shown below. In this embodiment, the measurement start condition is satisfied when the requirements a to c are satisfied. Note that Th1 in requirement c means the same temperature as "Th1" in FIG. 4.

(Requirement a) The ECU 500 is executing the my room mode.

(Requirement b) The air conditioner 320 is driven after the external charging of the assembled battery 130 is started.

(Requirement c) The temperature of the assembled battery 130 is lower than a predetermined temperature (hereinafter referred to as "Th1").

Hereinafter, the measurement start condition will be described with reference to FIGS. 7 to 10. In FIGS. 7 to 10, the current on the discharge side is represented by positive (+), and the current on the charge side is represented by negative (−).

Figure 7:
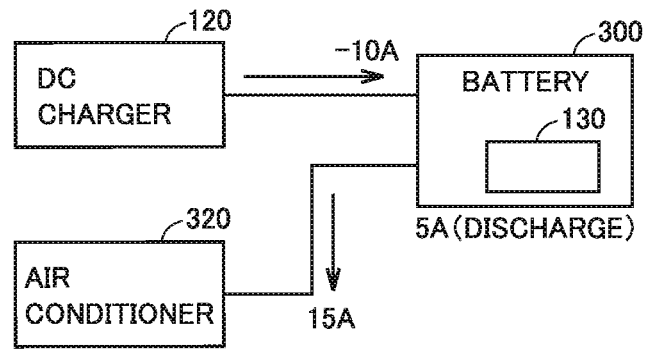
FIG. 7 is a diagram showing an example of the current of the assembled battery when the air conditioner is driven during execution of external charging of the assembled battery in a low temperature state in the permission mode.

FIG. 7 is a diagram showing an example of the current of the assembled battery 130 when the air conditioner 320 is driven during external charging of the assembled battery 130 in a low temperature state in the my room mode (permitted mode). In the example shown in FIG. 7, the temperature of the assembled battery 130 is the temperature $T_L$ shown in FIG. 4. Referring to FIG. 7 together with FIG. 4, in the my room mode, when air conditioner 320 is driven during external charging of assembled battery 130 in a low temperature state, assembled battery 130 outputs electric power larger than the supplied electric power to air conditioner 320 while receiving electric power from the outside of the vehicle. Since the temperature of the assembled battery 130 is low, Win (input limit value) becomes small (FIG. 4). In this embodiment, when the temperature of the assembled battery 130 is lower than Th1, Win becomes smaller than the driving power of the air conditioner 320. In the example shown in FIG. 7, a current of −10 A is input to the assembled battery 130 from the outside of the vehicle via the DC charger 120. In the assembled battery 130 having the temperature $T_L$ (FIG. 4), the input power of the assembled battery 130 matches Win when the input current of the assembled battery 130 is −10 A. The input current of the assembled battery 130 is limited by Win. The assembled battery 130 outputs electric power for driving the air conditioner 320 while receiving electric power equivalent to Win. In the example shown in FIG. 7, a current of 15 A is output from the assembled battery 130 to the air conditioner 320. Therefore, the assembled battery 130 is in a discharged state (while receiving electric power). The discharge current of the assembled battery 130 is substantially 5 A.

Figure 8:
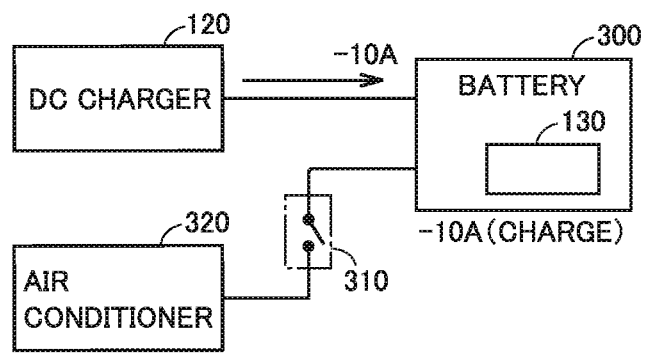
FIG. 8 is a diagram showing an example of a current of an assembled battery during external charging in a prohibited mode.

FIG. 8 is a diagram showing an example of the current of the assembled battery 130 during external charging in the normal mode (prohibited mode). In the example shown in FIG. 8, the temperature of the assembled battery 130 is the temperature $T_L$ shown in FIG. 4. Referring to FIG. 8 together with FIG. 4, in the normal mode, the assembled battery 130 during external charging does not output power to the air conditioner 320. In the normal mode, during external charging of the assembled battery 130, the DC/DC converter 310 cuts off the power path, and the air conditioner 320 is prohibited from being driven. In the example shown in FIG. 8, a current of −10 A is input to the assembled battery 130 from the outside of the vehicle via the DC charger 120, and no current is output from the assembled battery 130. Thus, in the example shown in FIG. 8, the assembled battery 130 is in a charged state. The charging current of the assembled battery 130 is −10 A. Even when the user does not use the air conditioner 320 during external charging of the assembled battery 130 in the my room mode, the assembled battery 130 enters the same state as the state shown in FIG. 8.

Figure 9:
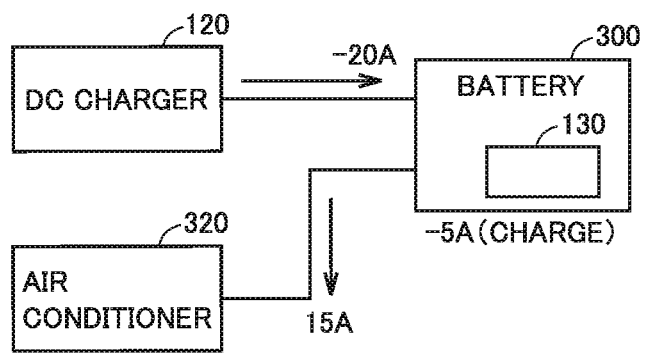
FIG. 9 is a diagram showing an example of the current of the assembled battery when the air conditioner is driven during execution of external charging of the assembled battery in a high temperature state in the permission mode.

FIG. 9 is a diagram showing an example of the current of the assembled battery 130 when the air conditioner 320 is driven during external charging of the assembled battery 130 in a high temperature state in the my room mode (permitted mode). In the example shown in FIG. 9, the temperature of the assembled battery 130 is the temperature Tx shown in FIG. 4. Referring to FIG. 9 together with FIG. 4, when air conditioner 320 is driven during external charging of assembled battery 130 in a high temperature state in the my room mode, assembled battery 130 receives electric power from the outside of the vehicle and outputs electric power smaller than the supplied electric power to air conditioner 320. Since the temperature of the assembled battery 130 is high, Win (input limit value) increases (FIG. 4). In this embodiment, when the temperature of the assembled battery 130 is higher than Th1, Win becomes larger than the driving power of the air conditioner 320. In the example shown in FIG. 9, a current of −20 A is input to the assembled battery 130 from the outside of the vehicle via the DC charger 120. The assembled battery 130 outputs electric power for driving the air conditioner 320 while receiving such electric power. In the example shown in FIG. 9, a current of 15 A is output from the assembled battery 130 to the air conditioner 320. Therefore, the assembled battery 130 maintains the charged state even after the air conditioner 320 is driven. The charging current of the assembled battery 130 is substantially −5 A.

For example, when the external charging of the assembled battery 130 is performed when the outside air temperature is low, and during this external charging, the user of the vehicle 50 instructs the ECU 500 to execute the mileage mode and the air conditioner 320 performs heating of the vehicle compartment, all of the above requirements a to c are easily satisfied. In this case, it is considered that the requirements a and c are satisfied, and the requirement b is satisfied last. When the requirement b is satisfied, the assembled battery 130 changes from the state shown in FIG. 8 to the state shown in FIG. 7, for example. That is, during external charging of the assembled battery 130, the assembled battery 130 is switched from a charged state to a discharged state (while receiving electric power).

Figure 10:
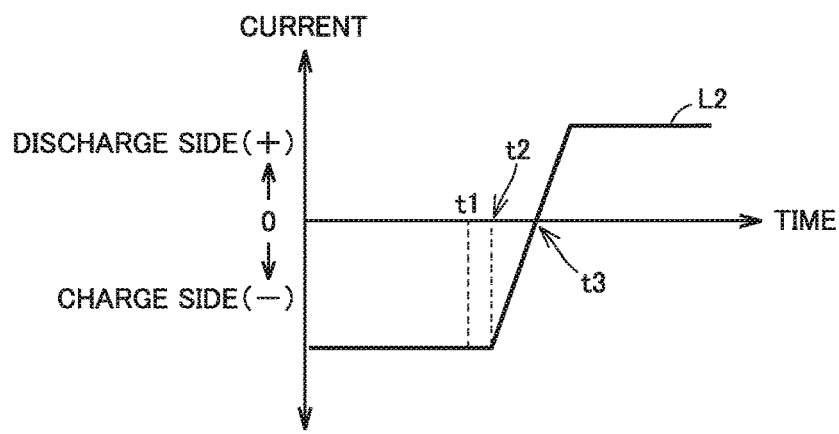
FIG. 10 is a diagram showing an example of the transition of the current of the assembled battery when the measurement start condition is satisfied during external charging of the assembled battery shown in FIG. 1.

FIG. 10 is a diagram showing an example of the transition of the current of the assembled battery 130 when the measurement start condition is satisfied during external charging of the assembled battery 130. The current value shown in FIG. 10 is a substantial current value of the assembled battery 130 obtained by combining the input current and the output current of the assembled battery 130. In FIG. 10, t1 to t3 indicate timings.

Referring to FIGS. 7 and 8 and FIG. 10, in this example, the my room mode is started at t1, and driving of the air conditioner 320 is started at t2. As shown by the line L2, when the air conditioner 320 is driven, the current value of the assembled battery 130 gradually increases toward the positive (+) side, and the assembled battery 130 changes from the state shown in FIG. 8 to the state shown in FIG. 7. At t3 during the transition from the state shown in FIG. 8 to the state shown in FIG. 7, the assembled battery 130 is switched from the charged state to the discharged state (while receiving electric power).

As described above, when the measurement start condition is satisfied, the assembled battery 130 is switched from the charged state to the discharged state (while receiving electric power). Therefore, the determination unit 511 shown in FIG. 3 can accurately determine whether or not the assembled battery 130 is switched from the charged state to the discharged state (while receiving electric power) based on whether or not the measurement start condition is satisfied. The determination unit 511 according to this embodiment determines that the assembled battery 130 is switched from the charged state to the discharged state (while receiving electric power) at the timing when the measurement start condition is satisfied. This is not exclusive, however, the determination unit 511 may determine that the assembled battery 130 is switched from the charged state to the discharged state (while receiving electric power) at a timing when a predetermined time (for example, about 15 seconds) has elapsed since the measurement start condition has been satisfied.

Referring again to FIGS. 1 to 3, the measurement unit 512 starts measuring the electrical resistance of the assembled battery 130 at the timing of switching from charging to discharging (hereinafter, also referred to as a "charge/discharge switching timing"). The charge/discharge switching timing is a timing when the assembled battery 130 is switched from the charged state to the discharged state (while receiving electric power). Whether or not the charge/discharge switching timing has arrived is determined by the determination unit 511. Hereinafter, a method of measuring the electric resistance of the assembled battery 130 will be described with reference to FIG. 11.

Figure 11:
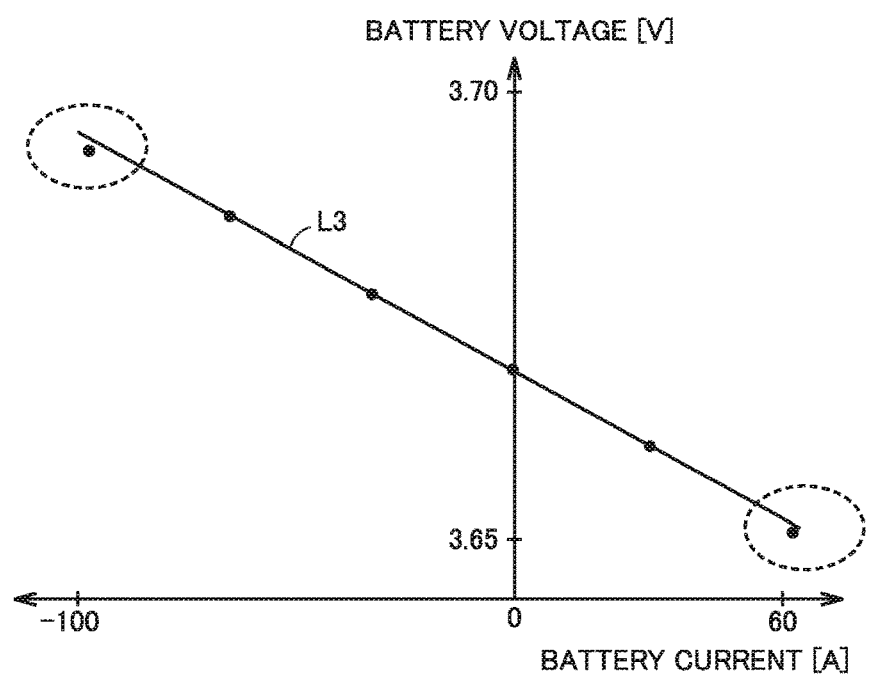
FIG. 11 is a graph showing a relationship between an actually measured current and a voltage in the assembled battery according to the embodiment of the present disclosure.

FIG. 11 is a graph showing the relationship between the current and the voltage actually measured by the present inventors with respect to the assembled battery 130 according to this embodiment. The present inventor plots actual measurement values on a plane in which the vertical axis represents the voltage of the assembled battery 130 and the horizontal axis represents the current of the assembled battery 130, and determined a regression line (line L3) by the least squares method.

Referring to FIG. 11, in a region where the current of assembled battery 130 is small (close to 0), the plotted data is located on a regression line (line L3). That is, the voltage and current of the assembled battery 130 have a linear relationship. On the other hand, when the current of the assembled battery 130 increases toward the positive side (discharge side) or the negative side (charge side), the relationship between the voltage and the current of the assembled battery 130 becomes nonlinear.

The measurement unit 512 shown in FIG. 3 obtains the electrical resistance of the assembled battery 130 based on the slope of the regression line (line L3). In this embodiment, the measurement unit 512 measures the electrical resistance for each parallel cell block included in the assembled battery 130. The measurement unit 512 measures the current and the voltage during discharge of the assembled battery 130, and obtains the relationship between the voltage and the current for each parallel cell block. Then, the measurement unit 512 obtains the electrical resistance for each parallel cell block based on the obtained relationship (more specifically, the slope of the regression line). The measurement of the current and the voltage of the assembled battery 130 by the measurement unit 512 is started at the charge/discharge switching timing. It is considered that the current of the assembled battery 130 is small at the charge/discharge switching timing. By starting the measurement at this timing, the measurement unit 512 can measure the electrical resistance of each parallel cell block with high accuracy. The measurement unit 512 may obtain an OCV (Open Circuit Voltage) of the assembled battery 130 based on the intercept of the regression line (line L3).

At the charge/discharge switching timing, the polarization generated during the charging of the assembled battery 130 is canceled by the discharging of the assembled battery 130 and becomes small. Since the polarization in the assembled battery 130 is reduced, the voltage drop of the assembled battery 130 due to the charge history is suppressed. It is believed that the effect of such discharge also makes the relationship between the voltage and the current of the assembled battery 130 close to linear.

Referring again to FIGS. 1 to 3, the diagnosis unit 513 is configured to diagnose the presence or absence of disconnection of the parallel cell blocks 100 included in the assembled battery 130 using the electrical resistances of the parallel cell blocks measured by the measurement unit 512. Hereinafter, a disconnection diagnosis method executed by the diagnosis unit 513 will be described with reference to FIG. 12.

Figure 12:
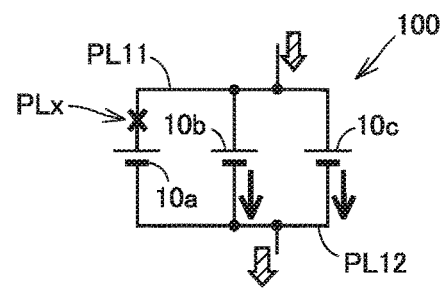
FIG. 12 is a diagram showing an example of a current when a disconnection occurs in a parallel cell block during charging.

FIG. 12 is a diagram showing an example of a current when a disconnection occurs in the parallel cell block 100 during charging. The parallel cell block 100 shown in FIG. 12 includes cells 10a to 10c connected in parallel.

Referring to FIG. 12, in this example, a disconnection occurs in a portion PLx in the vicinity of cell 10a, and electrical connection between cell 10a and power line PL11 is disconnected. Due to this disconnection, the cell 10a is separated from the parallel cell block 100, and the number of cells constituting the parallel cell block 100 is substantially two. Therefore, when the parallel cell block 100 is charged, no current flows through the cell 10a, and current flows only through the remaining cells 10b and 10c As a result, the magnitude of the current flowing per cell at the time of charging is about 1.5 times that at the time of normal operation (that is, when the cell is not separated). When a disconnection occurs in the parallel cell block 100, and any one of the cells 10 (e.g., the cell 10a) constituting the parallel cell block 100 is disconnected, current is concentrated in the remaining cells 10 (e.g., the cells 10b and 10c), and the electrical resistance of the parallel cell block 100 increases.

Referring again to FIGS. 1 to 3, the diagnosis unit 513 diagnoses the presence or absence of disconnection of the target block using the degree of deviation between the electric resistance of the target block and the electric resistance of the neighboring block, with any of the parallel cell blocks 100 included in the assembled battery 130 as the target block. Adjacent blocks are parallel cell blocks 100 located adjacent to the target block in one cell stack 200. In this embodiment, when the parallel cell blocks 100 exist on both sides of the positive electrode side and the negative electrode side of the target block in the cell stack 200, the parallel cell blocks 100 on the positive electrode side are employed as neighboring blocks. For example, when the parallel cell block 100-2 shown in FIG. 2 is a target block, the parallel cell block 100-1 located adjacent to the target block on the positive side becomes a neighboring block. On the other hand, when the parallel cell block 100-1 located at the end on the positive side in the cell stack 200 is the target block, the parallel cell block 100-2 located adjacent to the negative side of the target block becomes the adjacent block because the parallel cell block 100 does not exist adjacent to the positive side of the target block.

In this embodiment, the resistance ratio (That is, the ratio of the electric resistance of the target block to the electric resistance of the neighboring block.) is employed as the degree of deviation. The resistance ratio is a value obtained by dividing the electric resistance of the target block by the electric resistance of the neighboring block (=electric resistance of the target block/electric resistance of the neighboring block). When the resistance ratio is larger than a predetermined value (hereinafter referred to as "Th2"), the diagnosis unit 513 determines that a disconnection has occurred in the target block. In this embodiment, Th2 is greater than 1. The electric resistance of each of the target block and the neighboring block is measured by the measurement unit 512 by the method described above. The measurement error of the electrical resistance of each block (especially, the detection error by the voltage detection circuit 141 and the current detection circuit 142) is canceled out when calculating the ratio.

Although details will be described later, the diagnosis unit 513 according to this embodiment is configured to diagnose whether or not a disconnection has occurred in at least one parallel cell block 100 included in the assembled battery 130 by using the electrical resistance of each parallel cell block 100 measured by the measurement unit 512 (see FIG. 14). In this diagnosis, the diagnosis unit 513 performs a diagnosis on the target block while sequentially changing the target block.

Figure 13:
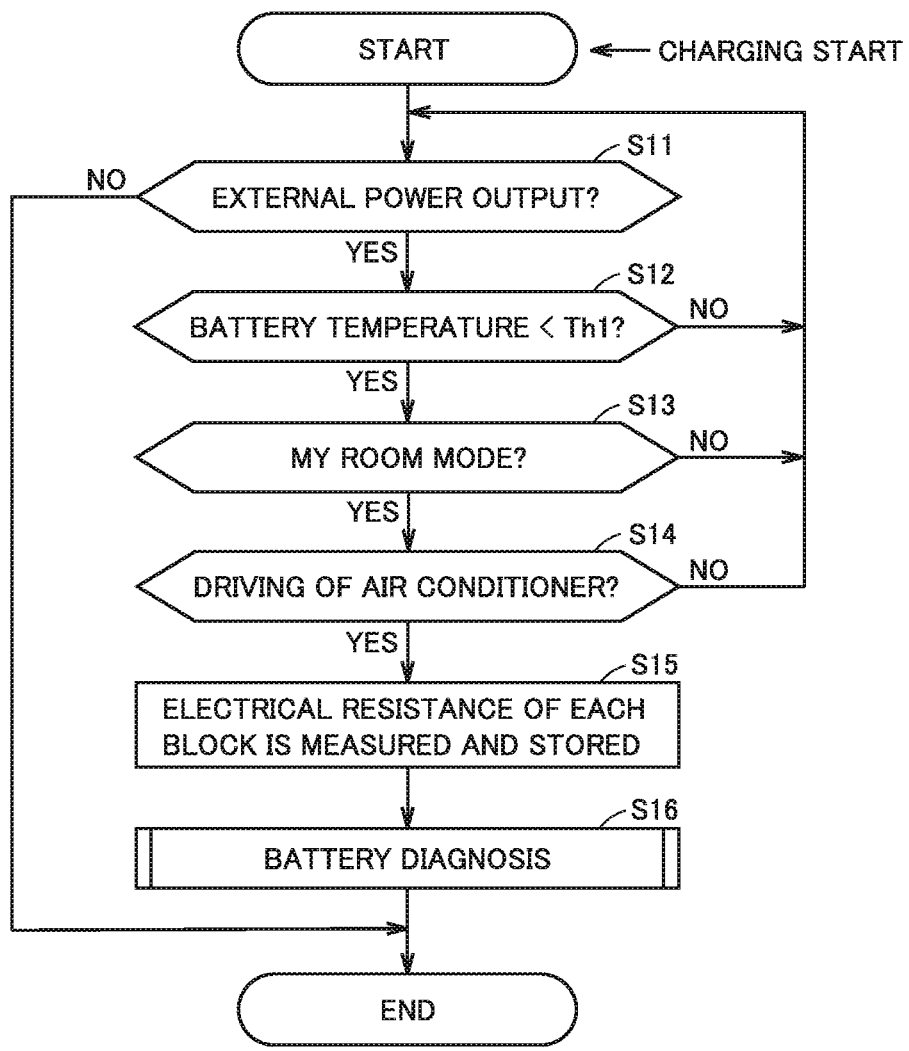
FIG. 13 is a flowchart showing a battery resistance measurement method according to an embodiment of the present disclosure.

FIG. 13 is a flowchart showing a battery resistance measurement method according to this embodiment. When external charging of the assembled battery 130 is started, a series of processes shown in FIG. 13 is started.

Referring to FIG. 13 together with FIGS. 1 to 3, the determination unit 511 determines whether or not the measurement start condition is satisfied in S11 to S14.

In S11, the determination unit 511 determines whether or not the assembled battery 130 is supplied with electric power from the outside of the vehicle 50. For example, when the external charging of the assembled battery 130 is completed, power supply to the inlet 110 from the outside of the vehicle is stopped, and power is not output from the DC charger 120 to the assembled battery 130. In this case, NO is determined in S11, and the series of processes shown in FIG. 13 ends.

On the other hand, if power is being output from the DC charger 120 to the assembled battery 130, YES is determined in S11. In this case, the process proceeds to S12. Thereafter, if YES is determined in all of S12 to S14, the process proceeds to S15. On the other hand, if NO is determined in any of S12 to S14, the process returns to the first step (S11).

In S12, the determination unit 511 determines whether or not the temperature of the assembled battery 130 is lower than Th1. During external charging of the assembled battery 130, Win (input limit value of the assembled battery 130) changes according to the temperature of the assembled battery 130 (see FIG. 4).

In S13, the determination unit 511 determines whether or not the mode switching unit 522 executes the my room mode. During external charging of the assembled battery 130, the user can cause the mode switching unit 522 to execute the my room mode by calling the process shown in FIG. 5 and selecting the my room mode on the selection screen (FIG. 6).

In S14, the determination unit 511 determines whether or not the air conditioner 320 is driven. In the film mode, the user can operate the input device 160 to start driving the air conditioner 320.

YES determination in all of S11 to S14 means that the aforementioned requirements a to c are satisfied. When the requirements a to c are satisfied, the determination unit 511 determines that the measurement start condition is satisfied. When the measurement start condition is satisfied, the determination unit 511 determines that the charge/discharge switching timing has arrived. When YES is determined in all of S11 to S14, the measurement unit 512 starts measuring the electric resistance of the assembled battery 130 in S15. In S15, the measurement unit 512 measures the electrical resistance of each parallel cell block 100 included in the assembled battery 130, and stores the measured data (electric resistance) in the storage device 503 (FIG. 1). Thereafter, the process proceeds to S16.

In S16, the diagnosis unit 513 diagnoses the presence or absence of disconnection of all parallel cell blocks 100 included in the assembled battery 130 using the electrical resistance of each parallel cell block 100 measured in S15.

Figure 14:
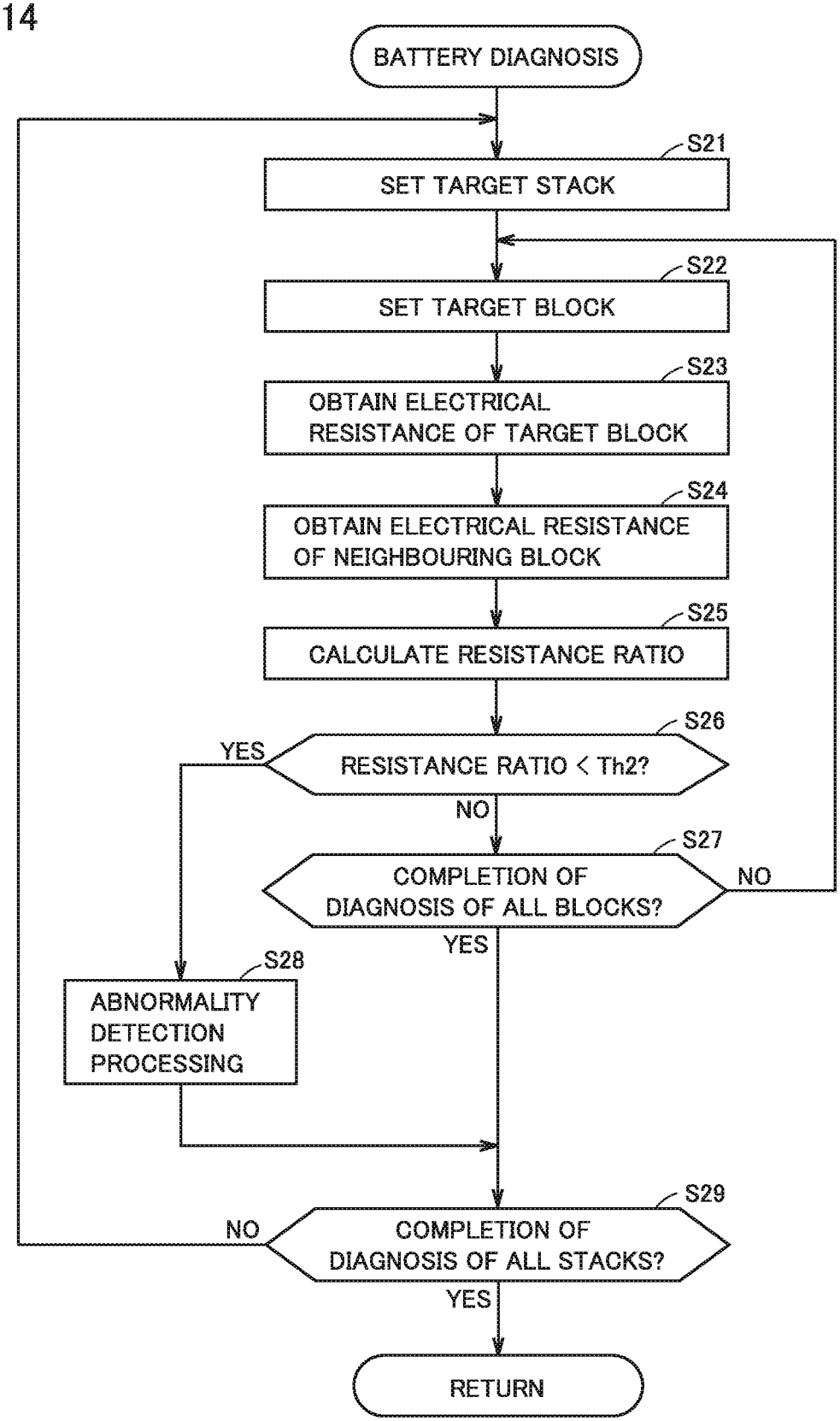
FIG. 14 is a flowchart showing details of battery diagnosis processing shown in FIG. 13.

FIG. 14 is a flowchart showing details of the battery diagnosis process (S16) shown in FIG. 13. Referring to FIG. 14 together with FIGS. 1 to 3, in S21, the diagnosis unit 513 sets any cell stack 200 included in the assembled battery 130 as the target stack. The diagnosis unit 513 changes the target stack every time the process of S21 is executed. In this embodiment, the diagnosis unit 513 sets the cell stacks 200-1 to 200-N included in the assembled battery 130 as the target stack in order from the positive electrode side. That is, first, the cell stack 200-1 is set as the target stack. However, the setting order of the target stack in S21 is not limited to the above, and may be arbitrary.

In S22, the diagnosis unit 513 sets any of the parallel cell blocks 100 included in the target stack set in S21 as the target block. The diagnosis unit 513 changes the target block each time the process of S22 is executed. In this embodiment, the diagnosis unit 513 sets parallel cell blocks 100-1 to 100-M included in the target stack as target blocks in order from the positive electrode side. That is, first, the parallel cell block 100-1 is set as the target block. However, the setting order of the target blocks in S22 is not limited to the above, and may be arbitrary.

In S23, the diagnosis unit 513 acquires the electrical resistance of the target block set in S22. Subsequently, in S24, the diagnosis unit 513 acquires the electrical resistance of the neighboring block. The electrical resistance of each of the target block and the neighboring block is measured in S15 of FIG. 13 and stored in the storage device 503 (FIG. 1).

In S25, the diagnosis unit 513 calculates the resistance ratio by dividing the electric resistance of the target block acquired in S23 by the electric resistance of the neighboring block acquired in S24. Subsequently, in S26, the diagnosis unit 513 determines whether or not the resistance ratio is greater than Th2. Th2 is a threshold value for determining whether a disconnection has occurred in the parallel cell block 100. When a disconnection occurs in the target block, the resistance ratio is larger than Th2. The resistance ratio greater than Th2 means that the resistance deviation degree is greater than a predetermined level and that the electric resistance of the target block is greater than the electric resistance of the neighboring block.

When the resistance ratio is equal to or less than Th2 (NO in S26), the diagnosis unit 513 determines that no disconnection has occurred in the target block, and the process proceeds to S27. In S27, the diagnosis unit 513 determines whether diagnosis of all parallel cell blocks 100 included in the target stack has been completed. In this embodiment, when the above-described diagnosis (S23 to S26) is performed using the parallel cell block 100-M as a target block, YES is determined in S27, and the process proceeds to S29. A YES determination in S27 means that no disconnection has occurred in the target stack. The diagnosis unit 513 may notify and/or record such a diagnosis result.

If the diagnosis of any of the parallel cell blocks 100 has not yet been completed in the target stack (NO in S27), the process returns to S22, the target block is changed in S22, and the above-described diagnosis (S23 to S26) is performed on the changed target block. For example, a parallel cell block 100-2 following the parallel cell block 100-1 is set as a target block.

When the resistance ratio is larger than Th2 (YES in S26), the diagnosis unit 513 determines that a disconnection has occurred in the target stack, and the process proceeds to S28. In S28, the diagnosis unit 513 executes a predetermined abnormality detection process. The predetermined abnormality detection process may include recording information indicating a diagnosis result (i.e., that a disconnection has occurred in the target stack). The diagnosis result may be recorded in the storage device 503 (FIG. 1). The recorded diagnostic results may be used in OBD (self-diagnosis).

The predetermined abnormality detection process may include notification of a diagnosis result. The notification of the diagnosis result may be performed by the notification device 170 (FIG. 1). The notification method is arbitrary, and the user may be notified by display on the display device (for example, display of characters or images), may be notified by sound (including sound) by a speaker, or may be turned on (including blinking) by a predetermined lamp. The predetermined abnormality detection process may include transmission of a diagnosis result. The diagnosis result may be transmitted to a server (not shown) outside the vehicle. When the process of S28 is executed, the process proceeds to S29.

In S29, the diagnosis unit 513 determines whether or not the diagnosis of all the cell stacks 200 included in the assembled battery 130 is completed. If the diagnosis of any of the cell stacks 200 has not been completed yet (NO in S29), the process returns to S21, and the target stack is changed in S21. For example, the cell stack 200-2 following the cell stack 200-1 is set as the target stack. Then, the above-described diagnosis is executed for each parallel cell block 100 included in the target stack after the change (S22 to S26).

In this embodiment, when the above-described diagnosis (S22 to S26) is performed using the cell stack 200-N as the target stack, a YES determination is made in S29. When YES is determined in S29, the series of processes shown in FIG. 14 ends. Thus, the process of S16 in FIG. 13 is ended, and the series of processes in FIG. 13 is also ended.

As described above, the battery resistance measurement method according to this embodiment measures the electric resistance of the assembled battery 130 (target battery). The battery resistance measurement method includes the following determination processing (S11 to S14 in FIG. 13) and measurement start processing (S15 in FIG. 13). In the determination processing, it is determined whether or not the assembled battery 130 is switched from the charged state to the discharged state (while receiving electric power) based on whether or not a predetermined measurement start condition is satisfied. In the measurement start processing, when it is determined that the assembled battery 130 is switched from the charged state to the discharged state (while receiving electric power) (YES in all of S11 to S14), the measurement of the electrical resistance of the assembled battery 130 is started. According to the battery resistance measurement method, the electrical resistance of the assembled battery 130 can be measured during a period in which the influence of polarization is small. Therefore, the electrical resistance of the assembled battery 130 can be measured with sufficient accuracy without measuring the polarization state of the assembled battery 130. Thus, the battery resistance measurement method can easily and accurately measure the electrical resistance of the assembled battery 130.

The above-described measurement start condition can be changed as appropriate. For example, when Win is always set low and Win is always smaller than the driving power of the air conditioner 320 irrespective of the temperature of the assembled battery 130, the requirement c may be omitted. That is, the measurement start condition may be satisfied when the requirements a and b are satisfied.

FIG. 15 is a diagram showing a modified example of the process shown in FIG. 13. The process shown in FIG. 15 is the same as the process shown in FIG. 13 except that S12 (FIG. 13) is omitted. By the ECU 500 executing the process shown in FIG. 15 instead of the process shown in FIG. 13, the measurement start condition is satisfied when the requirements a and b are satisfied.

In the above embodiment, the requirement b is satisfied when the air conditioner 320 is driven after the external charging of the assembled battery 130 is started. However, instead of or in addition to the air conditioner 320, the requirement b may be changed so as to be satisfied when another auxiliary device is driven. Similar to the air conditioner 320, other auxiliary devices may be included in the target auxiliary devices in the normal mode and the my room mode. Other auxiliary devices may be various heaters (e.g., at least one of a sheet heater and a mirror heater).

In the above-described embodiment, when the parallel cell blocks 100 exist on both sides of the positive electrode side and the negative electrode side of the target block in the cell stack 200, the parallel cell blocks 100 on the positive electrode side are employed as neighboring blocks. This is not exclusive, however, each of the two parallel cell blocks 100 located on both sides of the target block may be employed as a neighboring block. For example, in the process shown in FIG. 14, the resistance ratio may be calculated for each of the two parallel cell blocks 100 located on both sides of the target block in S25, and each resistance ratio may be compared with Th2 in S26. Then, if at least one of the resistance ratios is greater than Th2, YES may be determined in S26.

The method of diagnosing the battery using the battery resistance is not limited to the method shown in FIG. 14. For example, the ECU 500 may analyze the data (That is, the electrical resistance of each parallel cell block 100 included in the assembled battery 130) measured by the measurement unit 512 using an AI (artificial intelligence) to diagnose which parallel cell block 100 the abnormality has occurred.

Although the battery resistance measurement system 510 and the control system 520 are mounted on one computer (ECU 500) in the above embodiment, the battery resistance measurement system 510 and the control system 520 may be mounted separately on a plurality of computers. Further, the charging control unit 521 and the air conditioning control unit 523 may be separately mounted on a plurality of computers.

Instead of at least one of the input device 160 and the notification device 170 mounted on the vehicle 50, a mobile terminal carried by the user of the vehicle 50 may be employed. The mobile terminal may function as either an input device or a notification device. The mobile terminal may be configured to communicate wirelessly with the ECU 500. The user can handle such a mobile terminal in the same manner as the input device 160 and the notification device 170. Examples of mobile terminals include tablet terminals, smartphones, wearable devices, electronic keys, and service tools.

The target battery whose electric resistance is measured by the battery resistance measurement device is not limited to the assembled battery 130, and may be a single secondary battery (for example, a lithium ion secondary battery). The target battery is not limited to a battery mounted on a vehicle. The target battery may be used in vehicles other than vehicles (ships, airplanes, etc.), unmanned mobile bodies (automated guided vehicles (AGVs), agricultural machines, mobile robots, drones, spacecrafts, and the like.), wearable robots (e.g., care robots), stationary robots (e.g., industrial robots), or buildings (homes, factories, etc.).

Although the present disclosure has been described and illustrated in detail, it is clearly understood that the same is by way of illustration and example only and is not to be taken by way of limitation, the scope of the present disclosure being interpreted by the terms of the appended claims.

What is claimed is:

1. A vehicle comprising:
a target battery;
a battery resistance measurement device that measures an electrical resistance of a battery, the battery resistance measurement device comprising:
a determination unit that determines, based on whether a predetermined condition is satisfied, whether the target battery has switched from a charged state to a discharged state in which while the target battery receives supplied electric power the target battery outputs electric power larger than the supplied electric power;
a measurement unit that starts measuring the electrical resistance of the target battery at a time when the determination unit determines that the target battery is switched from the charged state to the discharged state
an auxiliary device that receives electric power from the target battery; and
a control device that switches a plurality of types of control modes,
the plurality of types of control modes including:
a prohibition mode which prohibits driving the auxiliary device with electric power output from the target battery when the target battery receives electric power from outside the vehicle; and
a permission mode which permits driving the auxiliary device with electric power output from the target battery when the target battery receives electric power from outside the vehicle,
the predetermined condition including:
a condition that the control device is executing the permission mode; and
a condition that the auxiliary device is driven after charging the target battery with electric power supplied from outside the vehicle is started.

2. The battery resistance measurement device according to claim 1, further comprising a diagnosis unit, wherein the target battery is an assembled battery including a plurality of parallel cell blocks, the plurality of parallel cell blocks each include a plurality of secondary batteries connected in parallel, the plurality of parallel cell blocks are connected in series to one another, the measurement unit measures an electrical resistance of at least one parallel cell block included in the assembled battery, and the diagnosis unit diagnoses, based on an electrical resistance of a target block, whether the target block is disconnected, the target block being any parallel cell block included in the assembled battery.

3. The battery resistance measurement device according to claim 2, wherein the diagnosis unit diagnoses, based on a degree of deviation between the electrical resistance of the target block and an electrical resistance of a parallel cell block located adjacent to the target block in the assembled battery, whether the target block is disconnected.

4. The battery resistance measurement device according to claim 2, wherein the measurement unit measures an electrical resistance of each parallel cell block included in the assembled battery, and the diagnosis unit sequentially changes the target block to diagnose, based on the electrical resistance of each parallel cell block measured by the measurement unit, whether there is disconnection in the assembled battery.

5. The battery resistance measurement device according claim 1, wherein the measurement unit measures a current and a voltage while the target battery discharges electric power, and the measurement unit measures the electrical resistance of the target battery based on the measured current and voltage.

6. The vehicle according to claim 1, wherein the auxiliary device is an air conditioner that performs air-conditioning for an interior of the vehicle.

7. The vehicle according to claim 1, wherein the control device sets an input limit value depending on a temperature of the target battery and controls a current input to the target battery so that the target battery does not receive electric power exceeding the input limit value, the control device sets the input limit value such that a first value is lower than a second value, the first value being the input limit value when the temperature of the target battery is lower than a predetermined temperature, the second value being the input limit value when the temperature of the target battery is higher than the predetermined temperature, and the predetermined condition further includes a condition that the temperature of the target battery is lower than the predetermined temperature.

8. The vehicle according to claim 7, wherein the target battery includes a lithium ion secondary battery; and the control device sets the input limit value so that lithium metal is not precipitated on a negative electrode of the lithium ion secondary battery.

* * * * *